(12) United States Patent
Kitamura

(10) Patent No.: US 6,504,365 B2
(45) Date of Patent: Jan. 7, 2003

(54) MAGNETIC FORCE MICROSCOPE

(75) Inventor: Shinichi Kitamura, Saitama (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/966,342

(22) Filed: Sep. 27, 2001

(65) Prior Publication Data

US 2002/0097046 A1 Jul. 25, 2002

(30) Foreign Application Priority Data

Sep. 29, 2000 (JP) ........................................ 2000-299178

(51) Int. Cl.[7] .............................................. G01R 33/02
(52) U.S. Cl. ...................................... 324/244; 250/306
(58) Field of Search ................................ 324/244, 260, 324/228, 244.1, 259; 250/306, 307; 73/105

(56) References Cited

U.S. PATENT DOCUMENTS

| | | | |
|---|---|---|---|
| 5,308,974 | 5/1994 | Elings et al. ................ 250/234 |
| 5,519,212 | * 5/1996 | Elings et al. ................ 250/234 |
| 6,281,495 | * 8/2001 | Kitamura .................... 250/306 |

OTHER PUBLICATIONS

"Frequency modulation detection using high–Q cantilevers for enhanced force microscope sensitivity", T.R. Albrecht et al., *J. Appl. Phys.* 69 (2), Jan. 15, 1991, pp. 668–673.

"Separation of Magnetic and Topographic Effects in Force Microscopy", C. Schönenberger et al., *J. Appl. Phys.* 67 (12), Jun. 15, 1990, pp. 7278–7280.

* cited by examiner

*Primary Examiner*—Jay Patidar
(74) *Attorney, Agent, or Firm*—Webb Ziesenheim Logsdon Orkin & Hanson, P. C.

(57) ABSTRACT

A magnetic force microscope capable of producing a topographic image containing no magnetic information. In the topographic imaging mode, an error amplifier controls the distance between a cantilever and the sample to cause the oscillation frequency of the cantilever to shift from $f_0$ to $f_1$, for causing a probe to tap each observation position $(x_i, y_j)$ on the sample. According to the results of the control, topographic information in the observation position $(x_i, y_j)$ is obtained. In the magnetic force imaging mode, the probe is placed on the observation position $(x_i, y_j)$, and the distance between the cantilever and the sample is held to the distance used in the topographic imaging mode according to information stored in the memory. At this time, the amplitude of the cantilever is so adjusted that the probe does not tap the sample. Magnetic information about the observation position $(x_i, y_j)$ on the sample is obtained based on the oscillation frequency of the cantilever at this time.

6 Claims, 5 Drawing Sheets

MAGNETIC FORCE MICROSCOPE

BACKGROUND OF THE INVENTION

1. Field of the Invention

The present invention relates to a magnetic force microscope (MFM) that is a type of scanning probe microscope (SPM) and acts to image the magnetic field distribution on the surface of a sample.

2. Description of the Related Art

FIG. 1 shows a conventional magnetic force microscope. In this instrument, an oscillator 102, such as a function generator, is set to produce an output signal having a frequency close to the resonance frequency of a cantilever 101. This output signal from the oscillator 102 is supplied to a piezoelectric element 103 for exciting the cantilever 101 into resonance oscillation. The cantilever 101 is forced to oscillate at that frequency.

The rear surface of the cantilever 101 is illuminated with laser light from a laser light source 104. Light reflected from the cantilever is detected by an optical detector 105 such as a quadrant photodiode. Oscillatory deflection of the cantilever 101 is detected by this optical detector. The output signal from the optical detector 105 is electrically amplified by a preamplifier 106 incorporating a band-pass filter.

The output signal from this preamplifier 106 is sent to an amplitude/dc voltage converter (RMS-DC) 107, which detects the amplitude of the deflection of the cantilever 101. Z direction (vertical) motion of a piezoelectric element scanner 111 is so controlled by an error amplifier 108 via a filter 109 and a z piezoelectric driver power supply 110 that the amplitude is maintained constant.

The amplitude kept constant by the error amplifier 108 is set by a reference voltage-setting means 112 to such a value that the probe of the cantilever 101 taps a sample 113. In this tapping mode, the oscillation of the cantilever 101 reflects the topographic information about the sample more strongly than magnetic information.

Under this condition, the output signal from the filter 109 that controls the z motion corresponds to the topography signal from the surface of the sample 113. Therefore, x- and y-scan signals are supplied to the piezoelectric element scanner 111 to scan it in two dimensions. A topographic image is obtained by using the z motion control signal.

Magnetic force imaging of the sample 113 is next described. The trajectories of scans made by the piezoelectric element scanner 111 (i.e., variations in z motion versus x and y scans) in the topographic imaging mode are stored in a memory 114. During magnetic force imaging, a switch $S_1$ is switched to the side of the memory 114. The piezoelectric element scanner 111 is so controlled based on the z position information stored in the memory 114 that a scan is again made across a position lower than the previous z position by a given amount Δz.

The phase difference between the oscillation signal (reference signal) from the oscillator 102 for exciting the cantilever into resonance oscillation and the output signal from the preamplifier 106 indicating the actual oscillation of the cantilever at this time is detected by a phase detector 115. The output signal from this phase detector is used as an MFM signal. In this way, a magnetic force image of the sample 113 is obtained.

During magnetic force imaging, the distance between the cantilever and the sample is set greater than during topographic imaging and the cantilever is kept out of contact with the sample as mentioned previously. In this non-contact mode, the oscillation of the cantilever reflects magnetic information about the sample more strongly than topographic information. Consequently, a magnetic force image free of the effects of topography of the sample can be obtained. The aforementioned topographic image and magnetic force image can be alternately obtained for each pixel, line, or frame.

The above-described magnetic force imaging is generally performed within atmosphere. If magnetic force imaging is performed within atmosphere by the use of the magnetic force microscope of FIG. 1, then a magnetic force image free of the effects of topography of the sample can be derived in a relatively short time.

However, where a method generally known as the slope detection method (i.e., topographic imaging is performed with the instrument of FIG. 1 in a vacuum), the Q value of the cantilever is quite large, as described by Albrecht T. R., Grütter P., Horne D., and Rugar D.; *J Appl. Phys.*, 69, 668 (1991). The cantilever easily oscillates. The result is that the responsiveness of amplitude variation deteriorates greatly. That is, the frequency range of the output signal from the amplitude/dc voltage converter 107 of the instrument shown in FIG. 1 narrows greatly.

Therefore, where a topographic image of the sample placed in a vacuum should be obtained by the magnetic force microscope of FIG. 1 using the slope detection method, the scan speed of the piezoelectric element scanner 111 needs to be made lower by one or more orders of magnitude than in imaging within atmosphere.

Furthermore, we have discovered that an accurate topographic image of a sample placed in a vacuum cannot be obtained by the use of the slope detection method, even if the scan speed is decreased as mentioned above.

This is described in further detail. If the sample is imaged within atmosphere with the instrument of FIG. 1, the reference voltage-setting means 112 is adjusted to reduce the amplitude of the cantilever to some extent. Under this condition, the probe tip of the cantilever intermittently touches, or taps, the sample surface. In this state, the amplitude of the cantilever is little affected by magnetic force.

In a vacuum, however, the amplitude of the oscillating cantilever is dominated by the effects of shift of the resonance frequency of the cantilever that is the principle of the non-contact atomic force microscope (NC-AFM). In consequence, the tapping mode cannot be accomplished during topographic imaging. In particular, if the oscillating cantilever placed in a vacuum is brought closer to the sample, the cantilever undergoing a force easily comes out of its narrow resonant frequency range. The amplitude decreases violently though the probe of the cantilever is not tapping the sample. Therefore, the probe of the cantilever never taps the sample if the reference voltage-setting means 112 is adjusted so as to reduce the amplitude of the cantilever to some extent.

For this reason, when a topographic image of the sample is obtained in a vacuum using the instrument of FIG. 1, the topographic image contains magnetic information about the sample. As such, the separation between the topographic image and the magnetic force image is insufficient.

In the instrument of FIG. 1, the piezoelectric element scanner 111 is caused to move a distance Δz for each pixel or for each line to achieve magnetic force imaging as mentioned previously. This z motion will oscillate the piezoelectric element scanner 111. The oscillation will be transmitted to other components of the instrument, making the imaging unstable.

In one method, the z position of the piezoelectric element scanner 111 is kept at a constant height. Under this condition, the piezoelectric element scanner 111 is scanned in the x- and y-directions. The deflection of the cantilever occurring at this time is detected and thus a magnetic force image is obtained. In this method, the tip-sample separation differs greatly from location to location. Consequently, an accurate magnetic force image cannot be obtained.

SUMMARY OF THE INVENTION

It is an object of the present invention to provide a magnetic force microscope which can produce a topographic image containing no magnetic information if the imaging is performed in a vacuum and which assures stable topographic imaging and magnetic force imaging.

This object is achieved in accordance with the teachings of the present invention by a magnetic force microscope comprising: a magnetized cantilever having a supported end and a free end located on opposite sides; a probe attached to the free end of the cantilever; an oscillation means for exciting the cantilever into oscillation such that the cantilever oscillates at a given oscillation frequency of $f_0$ and with a given amplitude when the cantilever is at such a distance from a sample that no force is exerted between the cantilever and the sample; a distance control means for controlling the distance between the cantilever and the sample to cause the oscillation frequency of the cantilever to shift from the oscillation frequency $f_0$ to $f_1$ ($f_1 < f_0$) so that the probe taps each observation position ($x_i$, $y_j$) on the sample; a means for obtaining topographic information about the sample in the observation position ($x_i$, $y_j$) on the sample, based on results of control provided by the distance control means; a position-setting means for placing the probe in the observation position ($x_i$, $y_j$) on the sample and maintaining the distance between the cantilever and the probe at a distance occurring when the topographic information is obtained; an amplitude control means for controlling the oscillation means in such a way that the amplitude of the cantilever excited into oscillation by the oscillation means does not permit the probe to tap the sample when the probe has been placed in position on the sample by the position-setting means; and a means for obtaining magnetic information about the sample in the observation position ($x_i$, $y_j$) on the sample based on the oscillation frequency of the cantilever when the probe has been placed in position by the position-setting means and the cantilever is oscillating such that the probe does not tap the sample under control of the amplitude control means.

Other objects and features of the invention will appear in the course of the description thereof, which follows.

DESCRIPTION OF THE PREFERRED EMBODIMENTS

Figure 1:
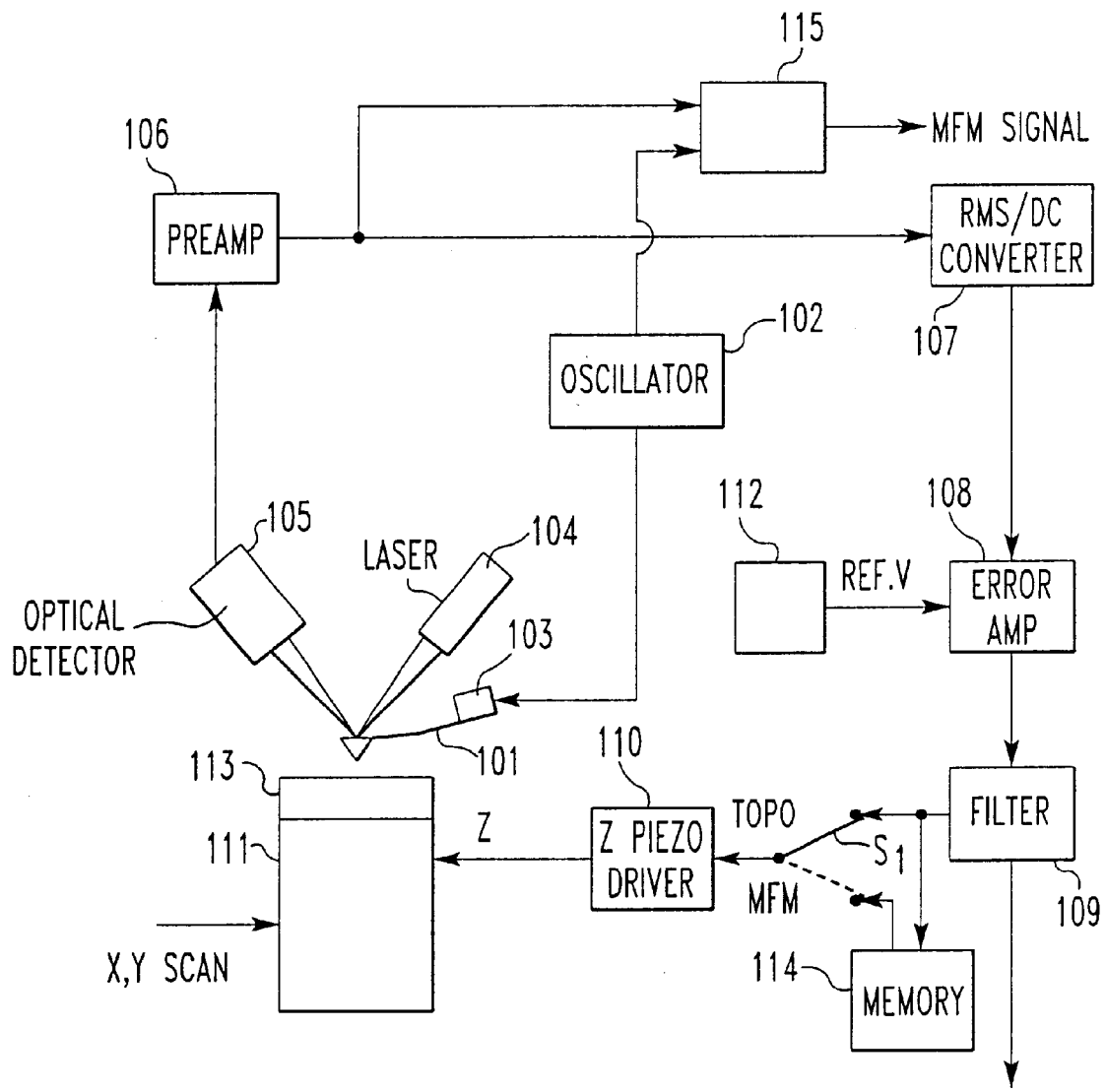
FIG. 1 is a block diagram of the prior art magnetic force microscope.

The preferred embodiments of the present invention are hereinafter described by referring to the drawings.

Figure 2:
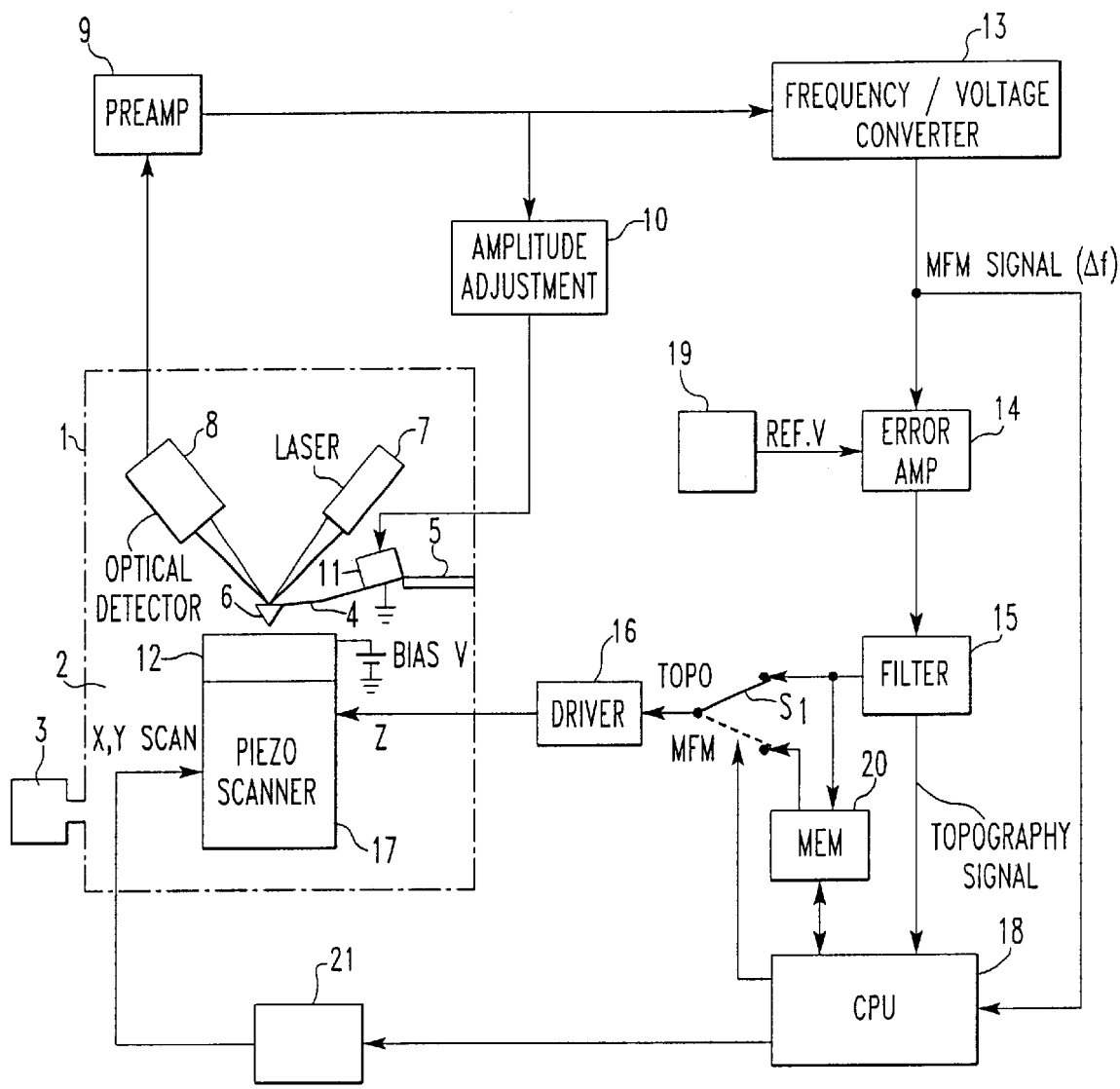
FIG. 2 is a block diagram of a magnetic force microscope in accordance with the present invention.

FIG. 2 shows a magnetic force microscope in accordance with the present invention. This microscope of FIG. 2 is first described.

A sample chamber wall 1 forms a sample chamber 2. The inside of this chamber 2 is evacuated to a high vacuum by a pumping system 3. A cantilever 4 is coated with a magnetic material. One end of the cantilever 4 is supported on a support portion 5. A probe 6 is attached to the other end. Oscillatory deflection of the cantilever 4 is detected by an optical lever comprising a laser light source 7 for directing laser light to the rear surface of the cantilever 4 and an optical detector 8 for detecting the laser light reflected from the rear surface of the cantilever 4. For example, the optical detector 8 consists of a quadrant photodiode.

A preamplifier 9 converts the output signal from the optical detector 8 into an electrical signal. This preamplifier 9 includes a bandpass filter matched to a frequency band close to the resonance frequency of the cantilever 4. The deflection signal from the cantilever 4 converted into an electrical signal by the preamplifier 9 is supplied into a piezoelectric element 11 for oscillation via an amplitude adjuster 10. This piezoelectric element 11 is mounted to the side of the supported end of the cantilever 4.

In the instrument of FIG. 2, an oscillation loop is formed to apply the deflection signal from the cantilever 4 into the piezoelectric element 11 via the amplitude adjuster 10. This oscillation loop further includes a phase shifter (not shown), and is designed to generate a positive feedback oscillation at the resonance frequency $f_0$ of the cantilever 4.

The oscillatory amplitude of the cantilever 4, or the amplitude of the output from the preamplifier 9, is controlled by the amplitude adjuster 10. The amplitude of the cantilever 4 is kept constant by automatic gain control (AGC) of the amplitude adjuster 10. As a result, the cantilever 4 is made to oscillate at its resonance frequency $f_0$ and with a given amplitude by an oscillation means forming the aforementioned oscillation loop when the cantilever 4 is so spaced from the sample 12 that no force is exerted between the cantilever 4 and the sample 12.

The output signal from the preamplifier 9, or the oscillation signal for the cantilever 4, is applied to the amplitude adjuster 10. The signal is also branched out into plural parts, one of which is fed to a frequency/voltage converter 13. This converter 13 produces a voltage corresponding to the oscillation frequency of the input signal, i.e., a frequency to voltage conversion is performed.

The gradient F' of the force exerted between the probe 6 and the sample 12 and the resonance frequency $f_0$ of the cantilever 4 having a spring constant of k have a relation given by $f_0 \propto \sqrt{k-F'}$. The frequency shift of the oscillation frequency of the cantilever 4 from the resonance frequency $f_0$ substantially corresponds to F'.

In the instrument of FIG. 2, the output signal from the frequency/voltage converter 13 is supplied to an error amplifier 14. This error amplifier 14 controls the z motion of the piezoelectric element scanner 17 via a filter 15 and a z piezoelectric driver power supply 16 such that the oscillation frequency of the cantilever 4 shifts by a given amount from the resonance frequency $f_0$. The piezoelectric element scanner 17 carries the sample 12 thereon.

When the z motion is controlled by the error amplifier 14, the switch $S_1$ mounted between the filter 15 and the z piezoelectric driver power supply 16 is switched to the side of the filter 15 by a central processing unit (CPU) 18 such that the filter 15 is electrically connected with the z piezoelectric driver power supply 16. The frequency shift kept constant by the error amplifier 14 is set by a reference voltage-setting means 19.

Referring to FIG. 2, a memory 20 is connected behind the filter 15. When the switch $S_1$ is switched to the side of the memory 20 from the side of the filter 15, the memory 20 is connected with the z piezoelectric driver power supply 16.

An x-y piezoelectric driver power supply 21 receives a control signal from the CPU 18 and drives the piezoelectric element scanner 17 in the x- and y-directions.

The output signal from the frequency/voltage converter 13 and the output signal from the filter 15 are supplied to the CPU 18, which in turn is connected with the amplitude adjuster 10, the reference voltage-setting means 19, and the memory 20 and can control them. The structure of the instrument of FIG. 2 has been described thus far. The operation of the instrument is described below.

The operation of the instrument in the topographic imaging mode is first described. In the topographic imaging mode, the CPU 18 connects the switch $S_1$ with the side of the filter 15 as indicated by the solid line. Also, the CPU 18 controls the amplitude adjuster 10 such that the oscillatory amplitude of the cantilever 4 assumes a relatively large value $A_1$. The amplitude adjuster 10 controlled in this way sets the amplitude of the cantilever 4 to the constant amplitude $A_1$. Therefore, if no force is exerted between the cantilever 4 and the sample 12, the cantilever 4 oscillates with the amplitude $A_1$ and at its resonance frequency $f_0$.

Furthermore, the CPU 18 controls the reference voltage-setting means 19 such that the voltage at which the error amplifier 14 is set by the reference voltage-setting means 19 is $V_1$. The reference voltage-setting means 19 controlled in this manner sets the reference voltage of the error amplifier 14 at $V_1$. The error amplifier 14 whose reference voltage is set to $V_1$ controls z motion of the piezoelectric element scanner 17 by controlling the z piezoelectric driver power supply 16 via the filter 15, in order to vary the oscillation frequency of the cantilever 4 from the resonance frequency $f_0$ to $f_1$ ($f_1 < f_0$) corresponding to the reference voltage $V_1$.

The set reference voltage $V_1$ is described in further detail. This reference voltage $V_1$ is used to cause the oscillation frequency of the cantilever 4 to shift by a large amount from $f_0$ to $f_1$, i.e., to produce a relatively large frequency shift. The oscillation frequency $f_1$ of the cantilever 4 under this condition is the oscillation frequency occurring when the probe 6 of the cantilever 4 is tapping the sample 12, and has been previously empirically found by us.

Because of the control operations described thus far, the probe 6 of the cantilever 4 taps the sample 12. The cantilever 4 oscillates at the frequency $f_1$. At this time, the amplitude of the cantilever 4 is maintained at the aforementioned value $A_1$.

When the cantilever 4 is oscillating in this way, the CPU 18 supplies a signal to the x-y piezoelectric driver power supply 21 to cause the piezoelectric element scanner 17 to make scans in two dimensions in the x- and y-directions. The power supply 21 scans the scanner 17 in the x- and y-directions according to the supplied scan signal. Because of the scanning of the piezoelectric element scanner 17, the sample 12 set on the scanner is also scanned in two dimensions in the x- and y-directions.

Figure 3:
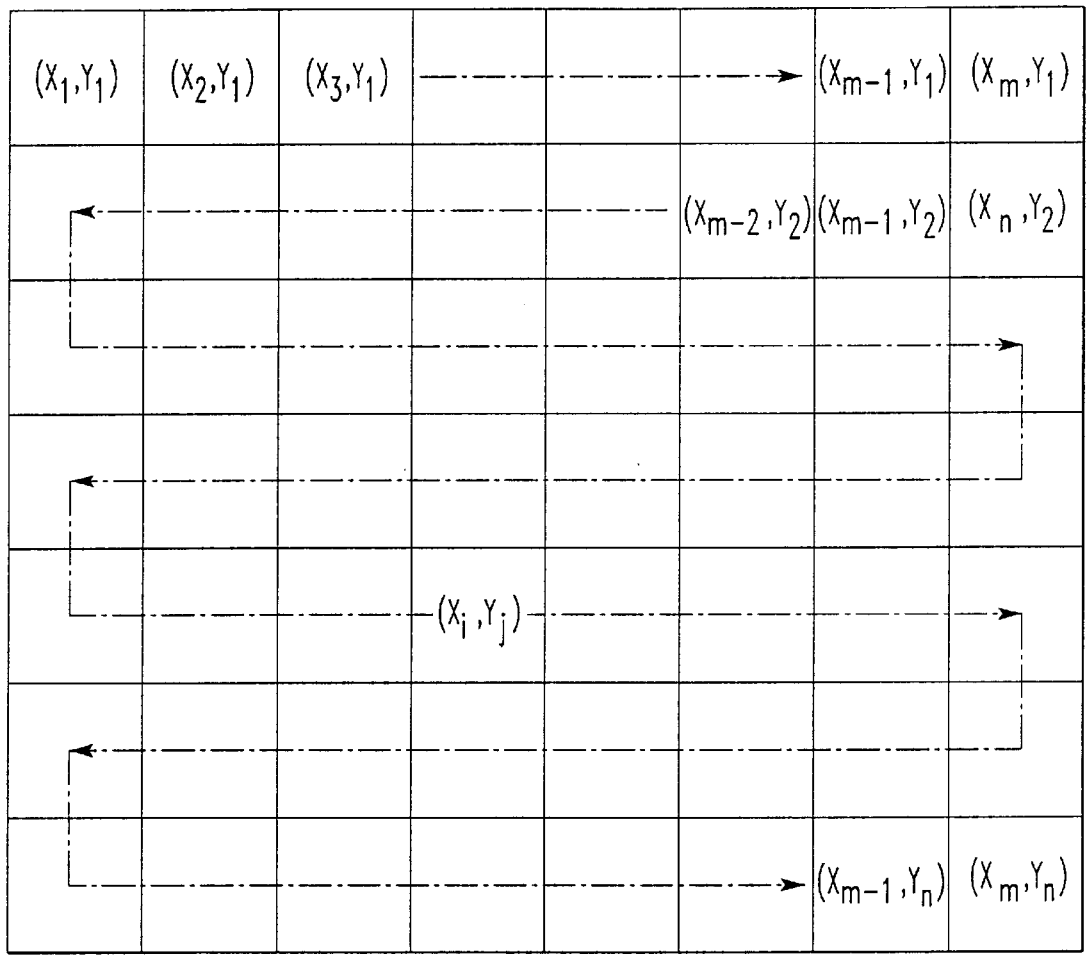
FIG. 3 is a diagram illustrating scans of a probe on a sample.

As the sample is scanned in this way, the probe 6 taps the observation positions $(x_1, y_1), (x_2, y_1), (x_3, y_1), \ldots, (x_{m-1}, y_1), (x_m, y_1), (x_m, y_2), (x_{m-1}, y_2), (x_{m-2}, y_2), \ldots, (x_i, y_j), \ldots, (x_{m-1}, y_n), (x_m, y_n)$ in succession, as shown in FIG. 3. That is, the probe taps the positions $(x_i, y_j)$ (where $i=1, 2, \ldots, m$; $j=1, 2, \ldots, n$) in succession. The probe scans across the sample. Even during this scan, the error amplifier 14 controls the z motion of the piezoelectric element scanner 17 to maintain the oscillation frequency of the cantilever 4 at the above-described frequency $f_1$. The output signal $z_{ij}$ ($i=1, 2, \ldots, m$; $j=1, 2, \ldots, n$) from the filter 15 controlling the z motion at this time corresponds to a topography signal representative of the topography of the surface of the sample 12 being observed.

The CPU 18 obtains topographical information by taking the image brightness signal in each scan position $(x_i, y_j)$ as the aforementioned z motion control signal $z_{ij}$ in each scan position $(x_i, y_j)$, and displays a topographic image of the observed region on the sample on the viewing screen of a display unit (not shown). This topographic image is obtained while the cantilever 4 is tapping the sample. The topographic image obtained under this condition is affected little by a magnetic force that is a long-range force acting between the probe and the sample. Hence, a topographic image containing no magnetic information can be derived.

During the topographic imaging operation described above, the z motion control signal $z_{ij}$ is correlated with each scan position $(x_i, y_j)$ and stored in the memory 20.

Figure 4:
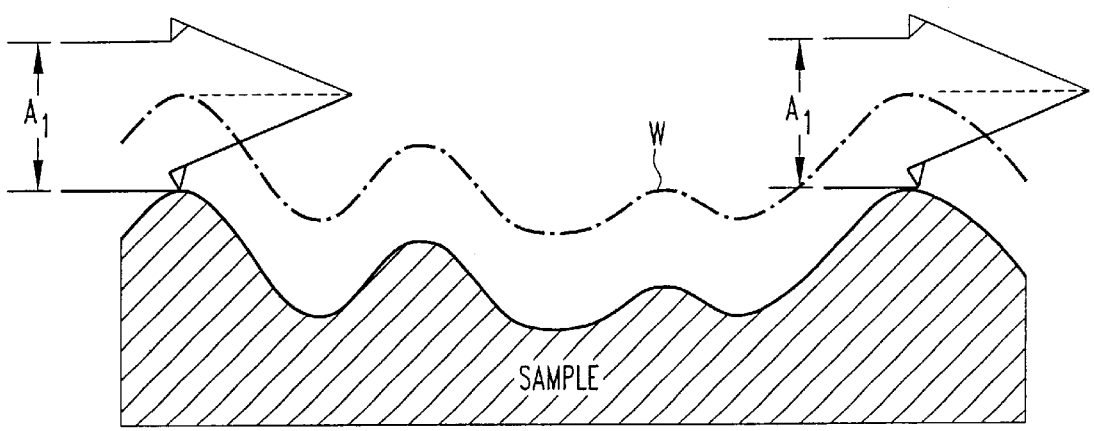
FIG. 4 is a view illustrating the trajectory W of a cantilever relative to a sample during topographic imaging.

FIG. 4 shows the trajectory W of the cantilever 4 across the sample 12 in the topographic imaging mode. As can be seen from this view, when the cantilever 4 is located at the lowest position, the probe 6 lightly taps the sample 12. The distance between the cantilever 4 and the sample 12 is kept constant at all times.

The operation of the instrument of FIG. 2 in the topographic imaging mode has been described thus far. The operation of the instrument in the magnetic force imaging mode is next described.

The CPU 18 first switches the switch $S_1$ to the side of the memory 20 as indicated by the broken line in FIG. 2. This cuts off the supply of the z motion control signal to the z piezoelectric driver power supply 16 from the filter 15. Therefore, the error amplifier 14 no longer provides feedback control of the piezoelectric element scanner 17.

The CPU 18 controls the amplitude adjuster 10 to set the amplitude of oscillation of the cantilever 4 at $A_2$ smaller than the amplitude $A_1$ assumed in the topographic imaging mode. Since the amplitude adjuster 10 controlled in this way sets the amplitude of the cantilever 4 at the given amplitude $A_2$, the cantilever 4 oscillates with the amplitude $A_2$ and at its resonance frequency $f_0$ while no force is exerted between the cantilever 4 and the sample 12. The amount by which the amplitude $A_2$ is smaller than the amplitude $A_1$ is described later.

When the cantilever 4 is oscillating, the CPU 18 supplies a signal to the x-y piezoelectric driver power supply 21 to cause the piezoelectric element scanner 17 to make x and y scans in exactly the same way as in the topographic imaging mode. In particular, the CPU 18 supplies an x-y scan signal $S(x_i, y_j)$ to the x-y piezoelectric driver power supply 21 to scan the probe 6 across observation positions $(x_i, y_j)$ (where $i=1, 2, \ldots, m$; $j=1, 2, \ldots, n$) shown in FIG. 3 in succession.

When the x-y scan signal $S(x_i, y_j)$ is supplied, the CPU 18 controls data readout from the memory 20 such that the z motion control signals $z_{ij}$ stored in the memory 20 are successively supplied to the z piezoelectric driver power supply 16 according to each x-y scan position $(x_i, y_j)$. The CPU 18 controls the data readout from the memory 20 to supply the z motion control signal $z_{ij}$ from the memory 20 to the z piezoelectric driver power supply 16 when the x-y scan position is $(x_1, y_1)$, for example.

The x-y piezoelectric driver power supply 21 receiving the x-y scan signal S $(x_i, y_i)$ scans the piezoelectric element scanner 17 in the x- and y-directions according to the supplied x-y scan signal. On the other hand, the z piezoelectric driver power supply 16 receiving the z motion control signal $z_{ij}$ controls the z motion of the piezoelectric element scanner 17 according to the supplied z motion control signal.

Figure 5:
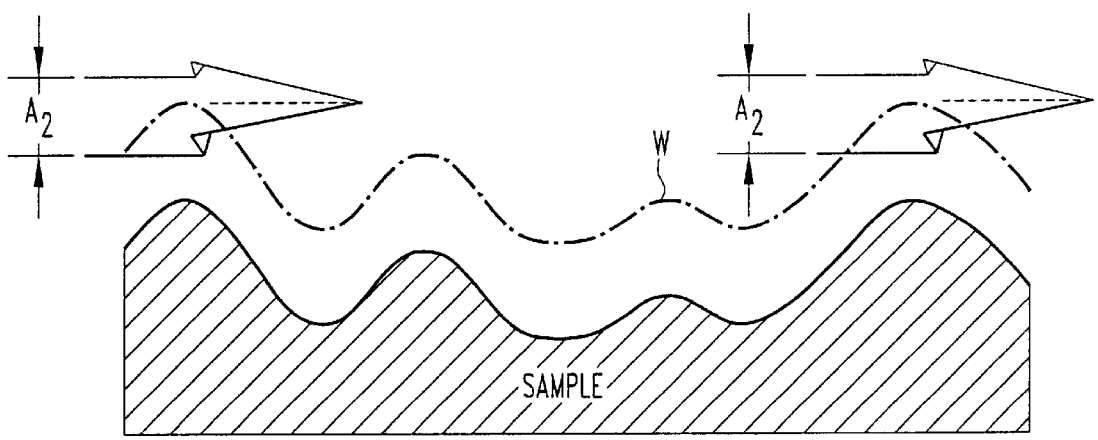
FIG. 5 is a view illustrating the trajectory of the cantilever relative to a sample during magnetic force imaging.

As the piezoelectric element scanner 17 is scanned in the x- and y-directions and moved in the z-direction in this way, the sample 12 set on the scanner is similarly scanned in the x- and y-directions and moved in the z-direction. As a result, the probe 6 is scanned across the observation positions $(x_i, y_i)$ on the sample 12 in succession. In each observation position, the distance between the cantilever 4 and the sample 12 is kept at the distance used in the topographic imaging mode. Consequently, as shown in FIG. 5, the trajectory of the cantilever 4 relative to the sample 12 in the magnetic force imaging mode is identical with the trajectory W occurring in the topographic imaging mode shown in FIG. 4.

As mentioned previously, in the magnetic force imaging mode, the amplitude of the cantilever 4 is set to $A_2$ smaller than the amplitude $A_1$ used in the topographic imaging mode. This can also be understood from FIG. 5. More specifically, the amplitude $A_2$ of the cantilever 4 is set to such a small value that the probe 6 does not tap the sample 12 when the probe 6 is placed in each observation position $(x_i, y_j)$ in the magnetic force imaging mode.

When the probe 6 does not tap the sample 12, i.e., in non-contact mode, the oscillation of the cantilever 4 is dominated by the magnetic force exerted between the probe 6 and the sample 12, and the variation in the frequency, or frequency shift, of the cantilever 4 strongly reflects the state of the magnetic field on the sample surface.

Accordingly, the CPU 18 obtains information about the magnetic force by taking the image brightness signal in each scan position $(x_i, y_j)$ as frequency shift $\Delta f$ (MFM signal) based on the output signal from the frequency/voltage converter 13, and displays a magnetic force image of the region of the sample 12 under observation on the viewing screen of the display unit (not shown). This magnetic force image contains almost no topographic information about the sample 12 for the reason described above.

While the operation of the instrument of FIG. 2 has been described thus far, topographic information containing no magnetic information can be obtained by an imaging operation performed in a vacuum with this instrument. Also, a magnetic force image containing no topographic information can be obtained.

With the instrument of FIG. 2, it is not necessary to cause the piezoelectric element scanner 17 to move a distance of $\Delta z$ in the z-direction whenever a magnetic force image is observed, unlike in the prior art technique. Otherwise, the piezoelectric element scanner 17 would be vibrated by the z motion, and the vibrations would be transmitted to other parts of the instrument. Therefore, topographic imaging and magnetic force imaging can be performed stably.

In the instrument of FIG. 2, topographic information is obtained by scanning the probe 6 across the sample 12 in one frame. Magnetic information is obtained by the next frame of scan. Collection of topographic information and collection of magnetic force information may be done alternately for each line scan of the probe 6 across the sample 12 or for each pixel. When the collection is switched between the two kinds of information for each line scan, a topographic image may be obtained by one going scan, and a magnetic force image may be obtained by one returning scan.

Figure 6:
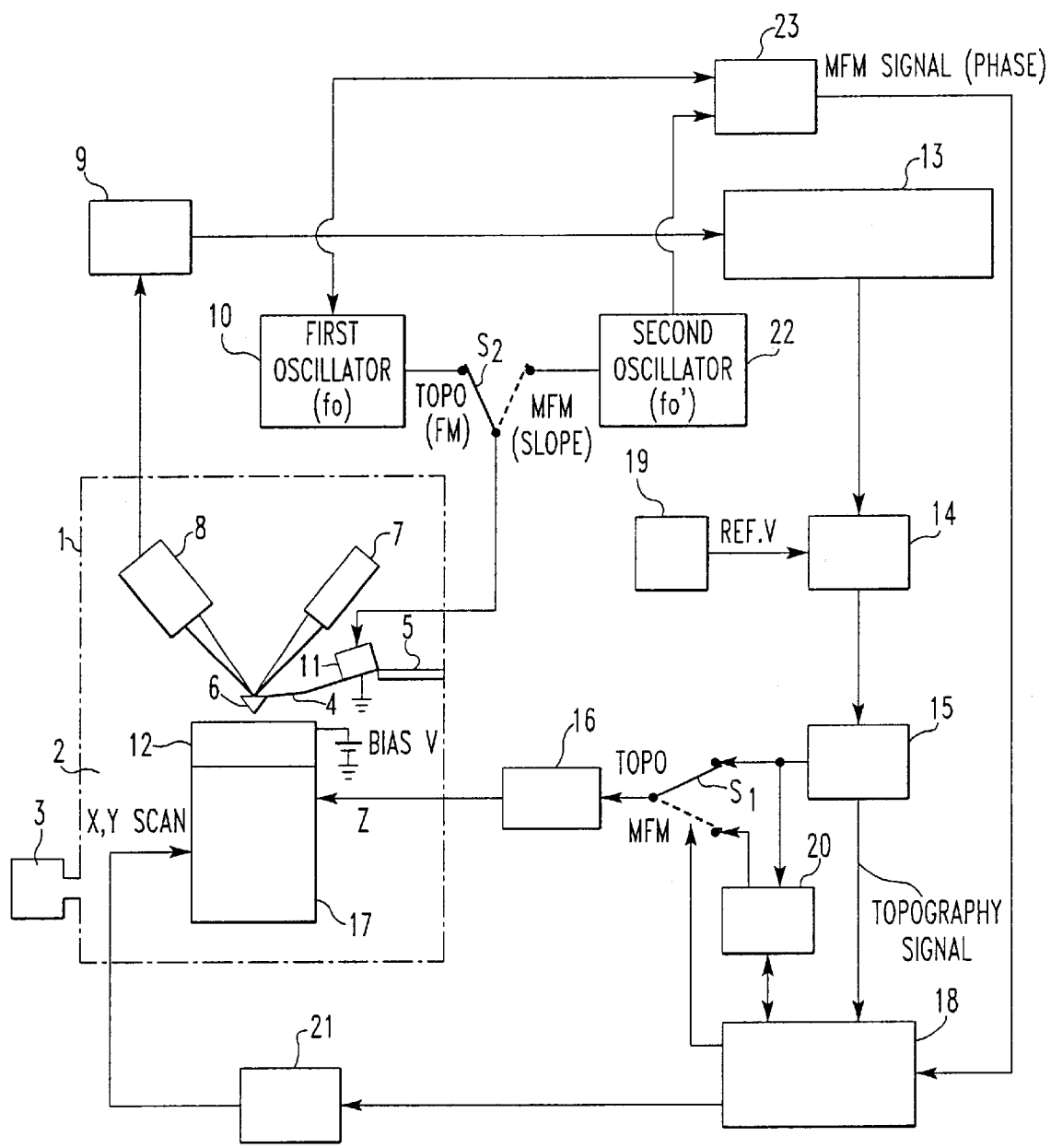
FIG. 6 is a block diagram of a magnetic force microscope in accordance with the present invention.

Another magnetic force microscope in accordance with the present invention is next described by referring to FIG. 6. Note that like components are indicated by like reference numerals in both FIGS. 2 and 6 and that those components which have been already described will not be described below.

Referring to FIG. 6, an oscillator 22 that is a second oscillation means is made of a function generator or the like set to $f_0'$ close to the resonance frequency of the cantilever 4. A switch $S_2$ is a selector means for selecting one of an oscillation signal from the oscillator 22 and the output signal from the amplitude adjuster 10 and supplying the selected one to the piezoelectric element 11 for oscillation. This switch $S_2$ is controlled by the CPU 18.

The oscillation signal (reference signal) from the oscillator 22 and the output signal from the preamplifier 9 indicative of actual oscillation of the cantilever 4 are supplied to a phase detector 23. This phase detector 23 detects the phase difference between them and supplies the resulting detection signal to the CPU 18.

The operation of the instrument of FIG. 6 is described. First, the operation in the topographic imaging mode is described. In this topographic imaging mode, the CPU 18 connects the switch $S_1$ with the side of the filter 15 as indicated by the solid line and connects the switch $S_2$ with the side of the amplitude adjuster 10 as indicated by the solid line. Because of this connection of the switch $S_2$, the oscillation signal from the first oscillation means forming the oscillation loop described above is fed to the piezoelectric element 11 for oscillation.

The CPU 18 controls the amplitude adjuster 10 such that the oscillation of the cantilever 4 assumes a relatively large amplitude $A_1$. The amplitude adjuster 10 controlled in this way sets the amplitude of the cantilever 4 at the constant amplitude $A_1$ and so the cantilever 4 oscillates with the amplitude $A_1$ and at its resonance frequency $f_0$ when no force is exerted between the cantilever 4 and the sample 12.

Furthermore, the CPU 18 controls the reference voltage-setting means 19 such that the error amplifier 14 is set at the voltage $V_1$ by the reference voltage-setting means 19. This voltage-setting means 19 controlled in this way sets the reference voltage of the error amplifier 14 at the voltage $V_1$. The error amplifier 14 whose reference voltage is set at the voltage $V_1$ controls the z piezoelectric driver power supply 16 via the filter 15 so that the oscillation frequency of the cantilever 4 shifts from the above-described frequency $f_0$ to $f_1$ $(f_1 < f_0)$ corresponding to the reference voltage $V_1$. Thus, the z motion of the piezoelectric element scanner 17 is controlled.

The reference voltage $V_1$ set here is described in detail. This reference voltage $V_1$ is used to cause the oscillation frequency of the cantilever 4 to shift by a large amount from $f_0$ to $f_1$, i.e., to produce a relatively large frequency shift. The oscillation frequency $f_1$ of the cantilever 4 under this condition is the oscillation frequency at which the probe 6 of the cantilever 4 is tapping the sample 12, and has been previously empirically found by us.

Because of the control operations described thus far, the probe 6 of the cantilever 4 taps the sample 12. The cantilever 4 oscillates at the frequency $f_1$. At this time, the amplitude of the cantilever 4 is maintained at the aforementioned value $A_1$.

When the cantilever 4 is oscillating in this way, the CPU 18 supplies a signal to the x-y piezoelectric driver power supply 21 to cause the piezoelectric element scanner 17 to make scans in two dimensions in the x- and y-directions. The power supply 21 scans the piezoelectric element scanner 17 in the x- and y-directions according to the supplied scan signal. Because of the scanning of the piezoelectric element scanner 17, the sample 12 set on the scanner is similarly scanned in two dimensions in the x- and y-directions.

As the sample 12 is scanned in this way, the probe 6 taps the observation positions $(x_1, y_1)$, $(x_2, y_1)$, $(x_3, y_1)$, ..., $(x_{m-1}, y_1)$, $(x_m, y_1)$, $(x_m, y_2)$, $(x_{m-1}, y_2)$, $(x_{m-2}, y_2)$, ..., $(x_i, y_j)$, ..., $(x_{m-1}, y_n)$, $(x_m, y_n)$ in succession, as shown in FIG. 3. That is, the probe 6 taps the positions $(x_i, y_j)$ (where i=1, 2, ..., m; j=1, 2, ..., n) in succession. The probe 6 scans across the sample 12. Even during this scan, the error amplifier 14 controls the z motion of the piezoelectric element scanner 17 to maintain the frequency of the cantilever 4 at the above-described $f_1$. The output signal $z_{ij}$ (i=1, 2, ..., m; j=1, 2, ..., n) from the filter 15 controlling the z motion at this time corresponds to a topography signal representative of the topography of the surface of the sample 12 being observed.

The CPU 18 obtains topographical information by taking the image brightness signal in each scan position $(x_i, y_j)$ as the aforementioned z motion control signal $z_{ij}$ in each scan position $(x_i, y_j)$, and displays a topographic image of the observed region on the sample 12 on the viewing screen of a display unit (not shown). This topographic image is obtained while the cantilever 4 is tapping the sample 12. The topographic image obtained under this condition is affected little by a magnetic force that is a long-range force acting between the probe 6 and the sample 12. Hence, a topographic image containing no magnetic information can be derived.

During the topographic imaging operation described above, the z motion control signal $z_{ij}$ is correlated with each scan position $(x_i, y_j)$ and stored in the memory 20.

The trajectory W of the cantilever 4 across the sample 12 in the topographic imaging mode is exactly the same as shown in FIG. 4. When the cantilever 4 is located at the lowest position, the probe 6 lightly taps the sample 12. The distance between the cantilever 4 and the sample 12 is kept constant at all times.

The operation of the instrument of FIG. 6 in the topographic imaging mode has been described thus far. The operation of the instrument in magnetic force imaging mode is next described.

The CPU 18 first switches the switch $S_1$ to the side of the memory 20 as indicated by the broken line in FIG. 6. This cuts off the supply of the z motion control signal to the z piezoelectric driver power supply 16 from the filter 15. Therefore, the error amplifier 14 no longer provides feedback control of the piezoelectric element scanner 17.

Also, the CPU 18 switches the switch $S_2$ to the side of the oscillator 22 as indicated by the broken line in FIG. 6. As a result, the aforementioned self-oscillating loop including the amplitude adjuster 10 no longer oscillates the cantilever 4. Instead, the cantilever 4 is forced to oscillate at its resonance frequency or at a frequency $f_0'$ close to it. The oscillator 22 has been previously adjusted so that the oscillatory amplitude of the cantilever 4 is $A_2$ that is smaller than the amplitude $A_1$ used in the topographic image mode. Therefore, when no force is exerted between the cantilever 4 and the sample 12, the cantilever 4 oscillates with the amplitude $A_2$ and at the oscillation frequency $f_0'$. The amount by which the amplitude $A_2$ is smaller than the amplitude $A_1$ is described later.

When the cantilever 4 is oscillating in this way, the CPU 18 supplies a signal 12 to the x-y piezoelectric driver power supply 21 to cause the piezoelectric element scanner 17 to make x and y scans in exactly the same way as in the topographic imaging mode. In particular, the CPU 18 supplies an x-y scan signal S $(x_i, y_j)$ to the x-y piezoelectric driver power supply 21 to scan the probe 6 across observation positions $(x_i, y_j)$ (where i=1, 2, ..., m; j=1, 2, ..., n) shown in FIG. 3 in succession.

When the x-y scan signal S $(x_i, y_j)$ is supplied, the CPU 18 controls data readout from the memory 20 such that the z motion control signals $z_{ij}$ stored in the memory 20 are successively supplied to the z piezoelectric driver power supply 16 according to each x-y scan position $(x_i, y_j)$. The CPU 18 controls the data readout from the memory 20 to supply the z motion control signal $z_{ij}$ from the memory 20 to the z piezoelectric driver power supply 16 when the x-y scan position is $(x_1, y_1)$, for example.

The x-y piezoelectric driver power supply 21 receiving the x-y scan signal S $(x_i, y_j)$ scans the piezoelectric element scanner 17 in the x- and y-directions according to the supplied x-y scan signal. On the other hand, the z piezoelectric driver power supply 16 receiving the z motion control signal $z_{ij}$ controls the z motion of the piezoelectric element scanner 17 according to the supplied z motion control signal.

As the piezoelectric element scanner 17 is scanned in the x- and y-directions and moved in the z-direction in this way, the sample 12 set on the scanner is similarly scanned in the x- and y-directions and moved in the z-direction. As a result, the probe 6 is scanned across the observation positions $(x_i, y_j)$ on the sample 12 in succession. In each observation position, the distance between the cantilever 4 and the sample 12 is kept at the distance used in the topographic imaging mode. Consequently, the trajectory of the cantilever 4 relative to the sample 12 in the magnetic force imaging mode is identical with the trajectory W occurring in the topographic imaging mode shown in FIG. 4.

As mentioned previously, in the magnetic force imaging mode, the amplitude of the cantilever 4 is set to $A_2$ smaller than the amplitude $A_1$ used in the topographic imaging mode. More specifically, the amplitude $A_2$ of the cantilever 4 is set to such a small value that the probe 6 does not tap the sample 12 when the probe 6 is placed in each observation position $(x_i, y_j)$ in the magnetic force imaging mode.

When the probe 6 does not tap the sample 12, i.e., in non-contact mode, the oscillation of the cantilever 4 is dominated by the magnetic force exerted between the probe 6 and the sample 12. The deviation in phase of the output signal from the preamplifier 9 indicative of oscillation of the cantilever 4 from the oscillation signal (reference signal) from the oscillator 22 strongly reflects the state of the magnetic field on the sample surface.

Accordingly, the CPU 18 obtains information about the magnetic force by taking the image brightness signal in each scan position $(x_i, y_j)$ as the output signal from the phase detector 23 (MFM signal) in each scan position $(x_i, y_j)$, and displays a magnetic force image of the region of the sample under observation on the viewing screen of the display unit (not shown). This magnetic force image contains almost no topographic information about the sample for the reason described above.

While the operation of the instrument of FIG. 6 has been described thus far, topographic information containing no magnetic information can be obtained by means of imaging performed in a vacuum with this instrument. Also, a magnetic force image containing no topographic information can be obtained.

With the instrument of FIG. 6, it is not necessary to cause the piezoelectric element scanner 17 to move a distance of $\Delta z$ in the z-direction whenever a magnetic force image is observed, unlike in the prior art technique. Otherwise, the piezoelectric element scanner 17 would be vibrated by the z motion, and the vibrations would be transmitted to other parts of the instrument. Therefore, topographic imaging and magnetic force imaging can be performed stably.

In the instrument of FIG. 6, topographic information is obtained by scanning the probe 6 across the sample 12 in one frame. Magnetic force information is obtained by the next frame of scan. Collection may be switched between collection of topographic information and collection of magnetic force information for each line scan of the probe 6 across the sample 12 or for each pixel. When the collection is switched between the two kinds of collection for each line scan, a topographic image may be obtained by one going scan, and a magnetic force image may be obtained by one returning scan.

Having thus described my invention with the detail and particularity required by the Patent Laws, what is desired protected by Letters Patent is set forth in the following claims.

What is claimed is:

1. A magnetic force microscope comprising:
   a magnetized cantilever having a supported end and a free end located on opposite sides;
   a probe attached to said free end of said cantilever;
   an oscillation means for exciting the cantilever into oscillation such that the cantilever oscillates at a given oscillation frequency of $f_0$ and with a given amplitude while the cantilever is at such a distance from a sample that no force is exerted between the cantilever and the sample;
   a distance control means for controlling the distance between said cantilever and said sample to cause the oscillation frequency of the cantilever to shift from the oscillation frequency $f_0$ to $f_1$ wherein $f_1$ is less than $f_0$ ($f_1 < f_0$) so that the probe taps observation positions ($x_i$, $y_j$) on the sample;
   a means for obtaining topographic information about the sample at the observation positions ($x_i$, $y_j$) on the sample, based on results of control provided by said distance control means;
   a position-setting means for placing the probe in said observation positions ($x_i$, $y_j$) on the sample and maintaining the distance between said cantilever and said probe at a distance occurring when the topographic information is obtained;
   an amplitude control means for controlling said oscillation means in such a way that the amplitude of the cantilever excited into oscillation by said oscillation means does not permit the probe to tap the sample when the probe has been placed in position on the sample by said position-setting means; and
   a means for obtaining magnetic information about the sample in the observation positions ($x_i$, $y_j$) on the sample based on the oscillation frequency of the cantilever when the probe has been placed in position by said position-setting means and the cantilever is oscillating such that the probe does not tap the sample under control of said amplitude control means.

2. The magnetic force microscope of claim 1, wherein collection of said topographic information and collection of magnetic information are alternately performed for each pixel, for each line scan of the probe across the sample, or for each frame of scan of the probe across the sample.

3. The magnetic force microscope of claim 1 or 2, wherein said cantilever and sample are placed in a vacuum.

4. A magnetic force microscope comprising:
   a magnetized cantilever having a supported end and a free end on opposite sides;
   a probe attached to said free end of said cantilever;
   a first oscillation means for exciting said cantilever into oscillation such that said cantilever oscillates at a given oscillation frequency of $f_0$ and with a given amplitude when said cantilever is spaced from a sample by such a distance that no force is exerted between the cantilever and the sample;
   a second oscillation means for exciting said cantilever into oscillation such that the oscillation frequency of said cantilever is held at a given oscillation frequency $f_0'$;
   a selector means for selecting one of excitation of said first oscillation means and excitation of said second oscillation means applied to the cantilever;
   a distance control means for controlling said selector means such that the cantilever is excited into oscillation by said first oscillation means and for controlling the distance between the cantilever and the sample to cause the oscillation frequency of said cantilever to shift from $f_0$ to $f_1$ wherein $f_1$ is less than $f_0$ ($f_1 < f_0$) so that said probe taps the observation positions ($x_i$, $y_j$) on the sample;
   a topographic means for obtaining topographic information about the sample in the observation positions ($x_i$, $y_j$) on the sample based on results of control provided by said distance control means;
   a position-setting means for placing said probe in the observation positions ($x_i$, $y_j$) on the sample and for maintaining the distance between said cantilever and said sample at a distance used on collection of said topographic information;
   an amplitude control means for controlling said selector means to cause said second oscillation means to excite the cantilever into oscillation when the probe is placed in position on the sample by said position-setting means and for controlling said second oscillation means such that the amplitude of said cantilever under this condition does not permit said probe to tap the sample; and
   a means for obtaining magnetic information about the sample in the observation positions ($x_i$, $y_j$) on the sample based on the phase difference between a signal indicating oscillation of the cantilever and the oscillation signal from said second oscillation means when the probe has been placed in position on the sample by said position-setting means and the cantilever is oscillating while said amplitude control means prevents the probe from tapping the sample.

5. The magnetic force microscope of claim 4, wherein collection of said topographic information and collection of magnetic information are alternately performed for each pixel, for each line scan of the probe across the sample, or for each frame of scan of the probe across the sample.

6. The magnetic force microscope of claim 4 or 5, wherein said cantilever and sample are placed in a vacuum.

* * * * *

UNITED STATES PATENT AND TRADEMARK OFFICE
CERTIFICATE OF CORRECTION

PATENT NO. : 6,504,365 B2
DATED : January 7, 2003
INVENTOR(S) : Shinichi Kitamura It is certified that error appears in the above-identified patent and that said Letters Patent is hereby corrected as shown below:

<u>Title page,</u>
Item [73], Assignee, "Jeol Ltd." should read -- JEOL Ltd. --.

<u>Column 2,</u>
Line 19, "Grüitter" should read -- Grütter --.

<u>Column 4,</u>
Line 55, between "$f_0$" and "$\sqrt{\ }$" insert -- $\alpha$ --.

Signed and Sealed this

Twenty-second Day of July, 2003

JAMES E. ROGAN
*Director of the United States Patent and Trademark Office*